United States Patent [19]
DiLauro et al.

[11] Patent Number: 5,387,899
[45] Date of Patent: Feb. 7, 1995

[54] ALARM SYSTEM WITH MONITORING CIRCUIT FOR DETECTING A CUT OR SHORT IN A PAIR OF WIRES

[75] Inventors: Amato A. DiLauro, Astoria, N.Y.; Richard J. Kriete, Hazlet, N.J.; George S. Micallef, Maplewood, N.J.; Vladimir Zaltsman, Bloomfield, N.J.

[73] Assignee: AT&T Corp., Murray Hill, N.J.

[21] Appl. No.: 99,116

[22] Filed: Jul. 29, 1993

[51] Int. Cl.⁶ .................... G08B 29/00; G01R 31/02
[52] U.S. Cl. .................... 340/514; 340/508; 340/513; 324/542; 324/555
[58] Field of Search ............... 324/500, 527, 537, 555, 324/556; 340/508, 512, 513, 514, 650, 652

[56] References Cited
U.S. PATENT DOCUMENTS

| | | | |
|---|---|---|---|
| 3,618,081 | 11/1971 | Morrow | 340/513 X |
| 4,376,277 | 3/1983 | Black | 340/513 X |
| 4,823,089 | 4/1989 | Eckhaus et al. | 324/556 X |
| 4,926,162 | 5/1990 | Pickell | 340/513 X |

OTHER PUBLICATIONS

"Adaptive Design Engineering, Alarm and Telemetry Systems", AT&T Network Systems brochure, 1991; includes inserts on Personal Computer Alarm Monitoring Systems, Alarm Monitoring System, & Alarm Telemetry System Primary Examiner—Gerard R. Strecker
Assistant Examiner—Diep Do
Attorney, Agent, or Firm—Werner Ulrich

[57] ABSTRACT

An alarm system is described wherein both an open connection between an alarm monitor and an alarmed unit or a short circuit across the connection between the monitor and the unit can be detected. A controllable, normally open test device is placed in parallel with a normally open alarm contact. If current flows when the test device is open, either a short circuit or an alarm condition exists. If current does not flow when the test device is closed, an open connection between the monitor and the unit exists. Advantageously, the integrity of connections between alarm monitors and alarmed units is enhanced.

14 Claims, 8 Drawing Sheets

ALARM SYSTEM WITH MONITORING CIRCUIT FOR DETECTING A CUT OR SHORT IN A PAIR OF WIRES

TECHNICAL FIELD

This invention relates to alarm systems, and more specifically, to arrangements for enhancing trouble detection of such systems.

PROBLEM

Most monitored element alarms are presented as a normally open relay closure (closed contacts imply an alarm condition). The "P" wires (a pair of wires) connecting this closure (at the "far" end) to the alarm sensing circuitry (at the "near" end) is vulnerable to being cut or shorted. A short is reported as a false equipment alarm, which is acceptable since it attracts attention. A wire cut, however, results in real equipment alarms not being reported. This may have disastrous consequences.

Previous solutions use the normally closed relay contacts as equipment alarms (open contacts imply an alarm condition). These detect cuts but not shorts. Also, multipling of alarms is awkward since they have to be wired in series. The normally open contacts are preferred by the industry. These contacts can easily be wired in parallel to multiple alarms.

SOLUTION

A simple electronic assembly (applique' circuit) is mounted at the "far" end of the "P" wires in very close proximity to the monitored alarm closure. This assembly has electrical characteristics similar to the alarm closure, that is it can be open or closed (high or low impedance). The alarm sensing circuitry periodically controls the state of this applique' (preferably using the same "P" wire) to simulate an alarm condition and thereby testing the integrity of the wire loop (See FIG. 1).

If alarms are to be multipied the applique' circuit (e.g., CR2) is placed at the farthest closure and the integrity of the whole wire run is maintained.

The arrangements can also be used with normally closed alarm contacts by placing a normally closed test device in series with the alarm contacts. In this case, a test is applied in order to detect wire shorts.

DETAILED DESCRIPTION

Figure 1:
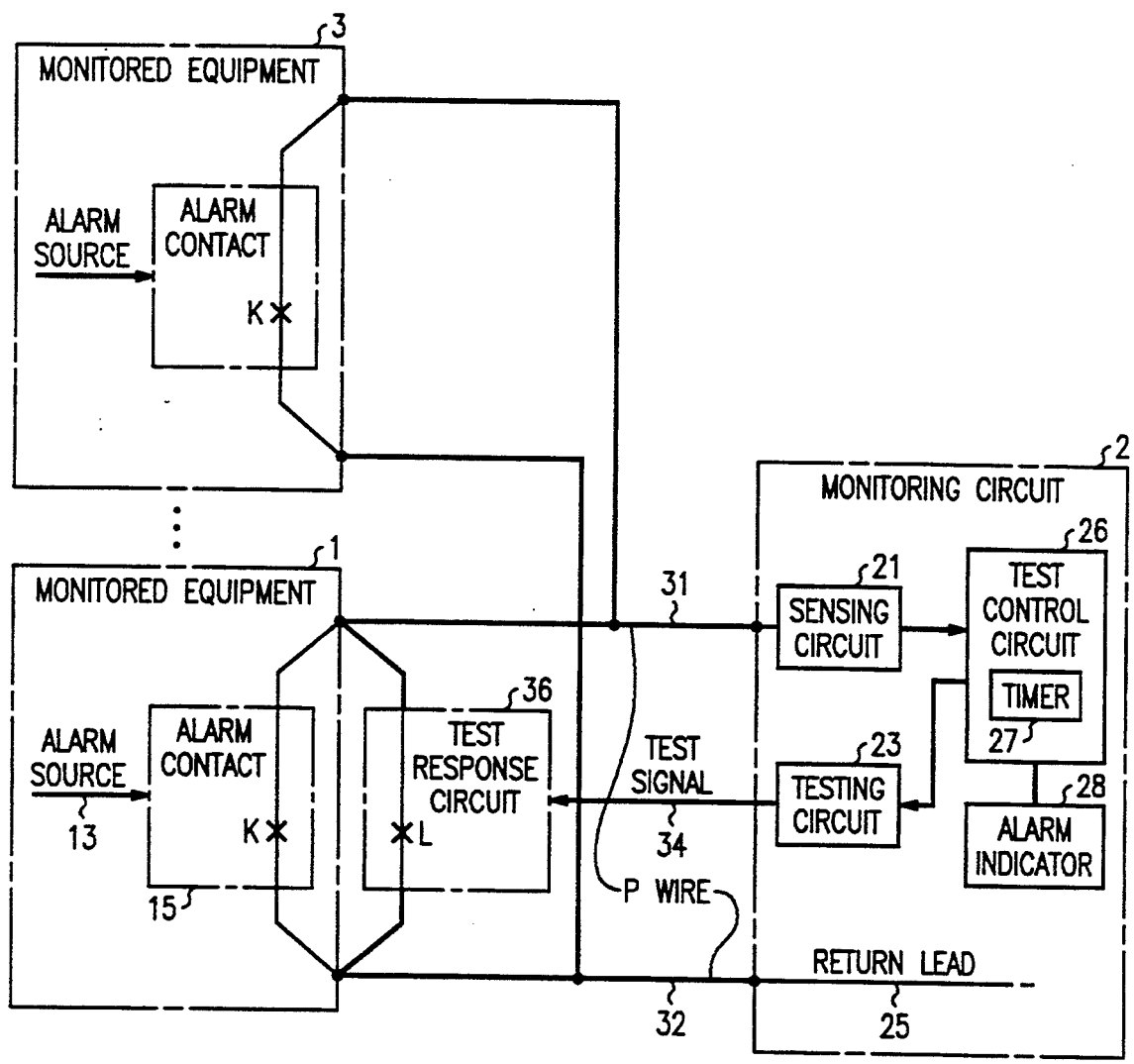
FIG. 1 is a block diagram illustrating the basic concept of applicants' invention.

FIG. 1 illustrates the operation of the alarm system of applicants' invention. Block 1 is the equipment being monitored. An alarm source 13 closes relay contact 15 when an alarm indication is detected. Monitoring circuit 2 is connected to the monitored equipment 1 by a pair of leads ("P" wires) 31 and 32. In parallel with alarm contact 15 is a normally open test circuit 36 with contact L for closing the circuit when a test signal 34 is applied. Testing circuit 23 applies the test signal and sensing circuit 21 senses whether either alarm contact 15 is closed or contact L in test response circuit 36 is closed. Means (not shown) for operating the test circuit periodically in order to ensure that the "P" wires have not been cut. When the test circuit 23 sends test signal 34, then the sensing circuit 21 should detect a closure. In this case, the closure means that the "P" wires have not been cut and is not an indication of an alarm. When the test circuit does not send test signal 34 and the sensing circuit 21 senses a circuit closure, then this is an indication that the alarm contact 15 has been closed and that an alarm indication exists. If the two "P" wires are shorted then sensing circuit 21 will also sense a completion of the circuit; in this case, this is not an alarm indication but an indication that the "P" wires have been shorted and must be repaired if the alarm indicator is to be useful.

The return lead 25 is connected to the second "P" wire (or equivalent if common ground is used). In the configurations of FIGS. 2, 4, 6, and 8, lead 25 is connected to ground. In the configurations of FIG. 3 and 7, lead 25 is a switched lead connected to ground or to battery via a resistor.

Test control circuit 26 is driven by a test control circuit including a microprocessor (not shown) and a timer 27. Test control circuit 26 drives testing circuit 23 and receives inputs from sensing circuit 21. Test control circuit 26 drives an alarm indicator 28 which can be audible, visual or graphic. Test control circuits with their timers and alarm indicators are well known in the prior art; one example is the remote unit of the NJ-00508 Series Alarm Telemetry System manufactured by AT&T Network Systems Services. This remote unit can control the periodic application of tests to ensure the integrity of the alarm system.

Figure 2:
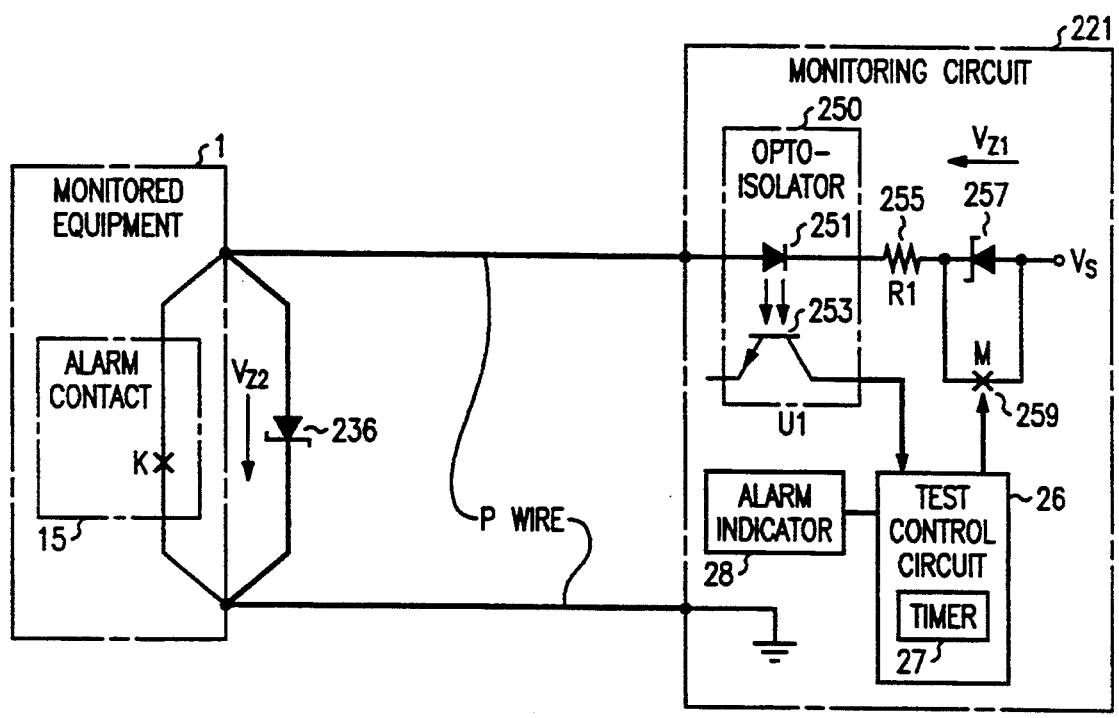
FIG. 2 is a specific implementation of applicants' invention using a zener diode as a device to be placed in parallel with a normally open alarm indication contact.
Figure 3:
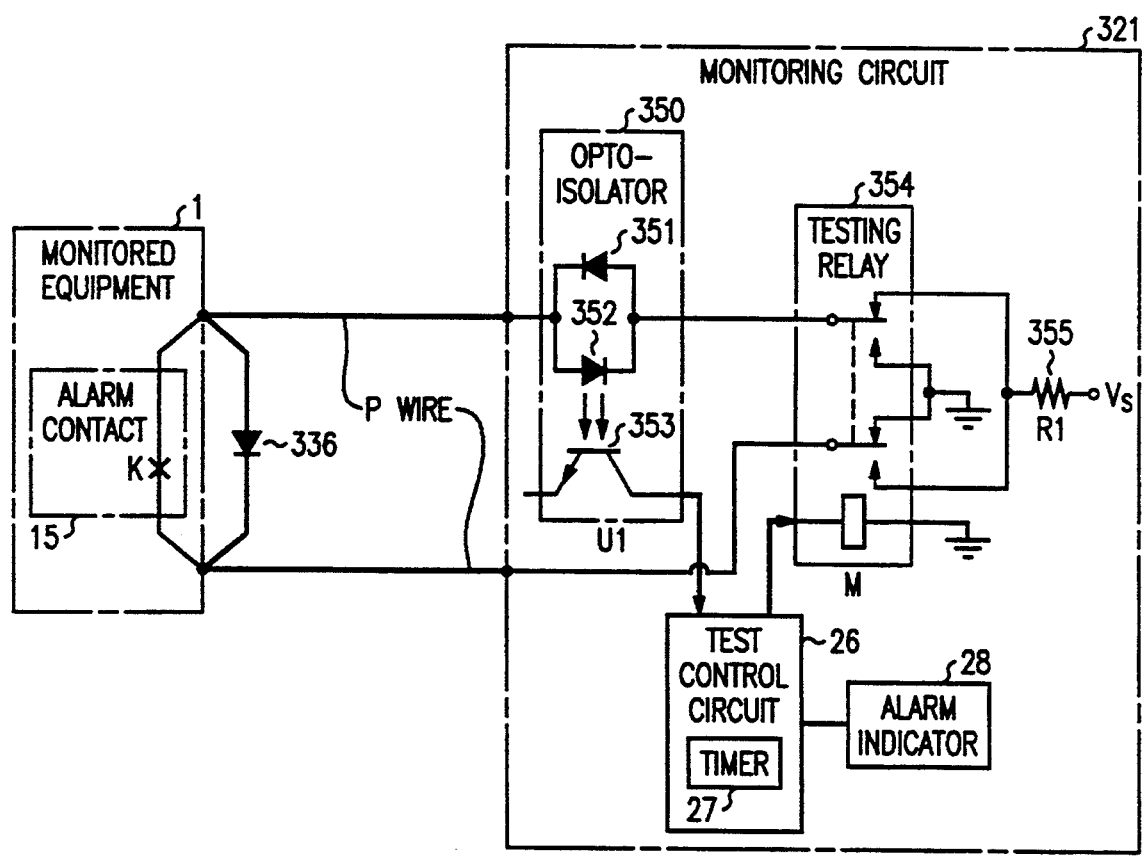
FIG. 3 is an alternate implementation using a diode across the alarm sensing contact and using a reverse voltage to test the integrity of the connection to the alarm indication contact.

FIG. 2 shows the essential of one such alarm sensing circuit. It consists of an opto-isolator 250 for TTL voltage level shifting, in order to drive a circuit connected to the transistor of the opto-isolator, a current limiting resistor (R1) (255), and a zener diode (257) with a normally open relay closure M across it. Office battery (−Vs) is connected at the anode of zener diode 257. Other types of logic circuits such as CMOS can be used instead of TTL. A standard "P" wire connects the monitored equipment alarm contact K to complete the loop to ground. The applique' circuit consists of a similar zener diode 236 and is connected across the alarm closure as shown. For simplicity, both zeners are chosen with identical breakdown voltages ($Vz1 = Vz2 = Vz$). It is critical that the chosen breakdown voltage (Vz) satisfies the condition $Vs/2 < Vz < Vs$.

For a typical −48 V alarm monitoring office battery, 33 V breakdown zeners are a good choice. Under normal conditions, both zener diodes are off since the office battery (48 V) is less than the combined breakdown voltage of the two zeners (66 V). This defines the "off" TTL state. When equipment goes in an alarm condition, closure K shorts zener diode 236. This causes the other zener diode 257 to break down since 48 V is now higher than its breakdown voltage of 33 V. The resulting current flows through the opto-isolator LED 251 which in turn changes the TTL level to the "on" state, i.e., causes the photo-transistor 253 to conduct. The monitoring circuitry will then report this as an equipment alarm.

The controlling circuitry (not shown) will periodically activate the closure of contact M to test the "P" wire loop. This shorts zener diode 257, which if all is well, will cause zener diode 236 to break down and generate a similar "on" TTL state. If this is not the case, a "system failure" alarm will be reported. The zener diode 236 in FIG. 2 and the alarm sensor is an optic isolator 250 comprising a photo diode 251 which emits light when current flows therethrough and a photo transistor 253 which closes a circuit (not shown) when it receives light from photo diode (LED) 251. Zener diode 257, is bypassed by contact M (259) when it is used to test the integrity of the "P" wires. Vs is insufficient to break down both of the zener diodes 257 and 236, but sufficient to break down zener diode 236 alone. Therefore, if zener diode 257 is bypassed, when contact M (259) is operated, current should flow through photo diode 251 and zener diode 236. In this arrangement no separate test wire is required to interconnect the monitored equipment and the sensing circuit. If a common ground can be used to interconnect these two blocks, only a single wire is required for their connection.

Applicants have found the zener diode approach to be the most attractive, especially where a common ground exists, since only a single "P" wire is required.

An alternative solution is shown in FIG. 3. Here the applique' circuit consists of a single diode 336. The controlling circuit consists of a DPDT relay M (354) which toggles office battery (−Vs) and ground across the "P" wires. Under normal conditions, diode 336 will be reverse biased and the dual polarity opto-isolator 350 will be off. During a loop test, relay M operates and the resulting change of polarity forward biases diode 336 and LED 351 of opto-isolator 350 which turns the opto-isolator to the "on" state. In a real alarm condition, closure of contact K (15) will short diode 336 and forward bias LED 352 of opto-isolator 350, which also turns on the opto-isolator transistor 353.

FIG. 3 thus substitutes the ability to apply reverse voltage to the "P" wires using contacts of testing relay M (354). In the normal mode, the M relay is released and no current flows through either diode 336 or diode 352 unless alarm contact K (15) is operated. When the M relay 354 is operated, current flows through diode 351, diode 336, and resistor 355, and photo transistor 353 becomes conductive because current is flowing through photo diode 351 thus generating the light which renders photo transistor 353 conductive. Note that the configuration of FIG. 3 requires two "P" wires since the common ground cannot be used without auxiliary.

Figure 4:
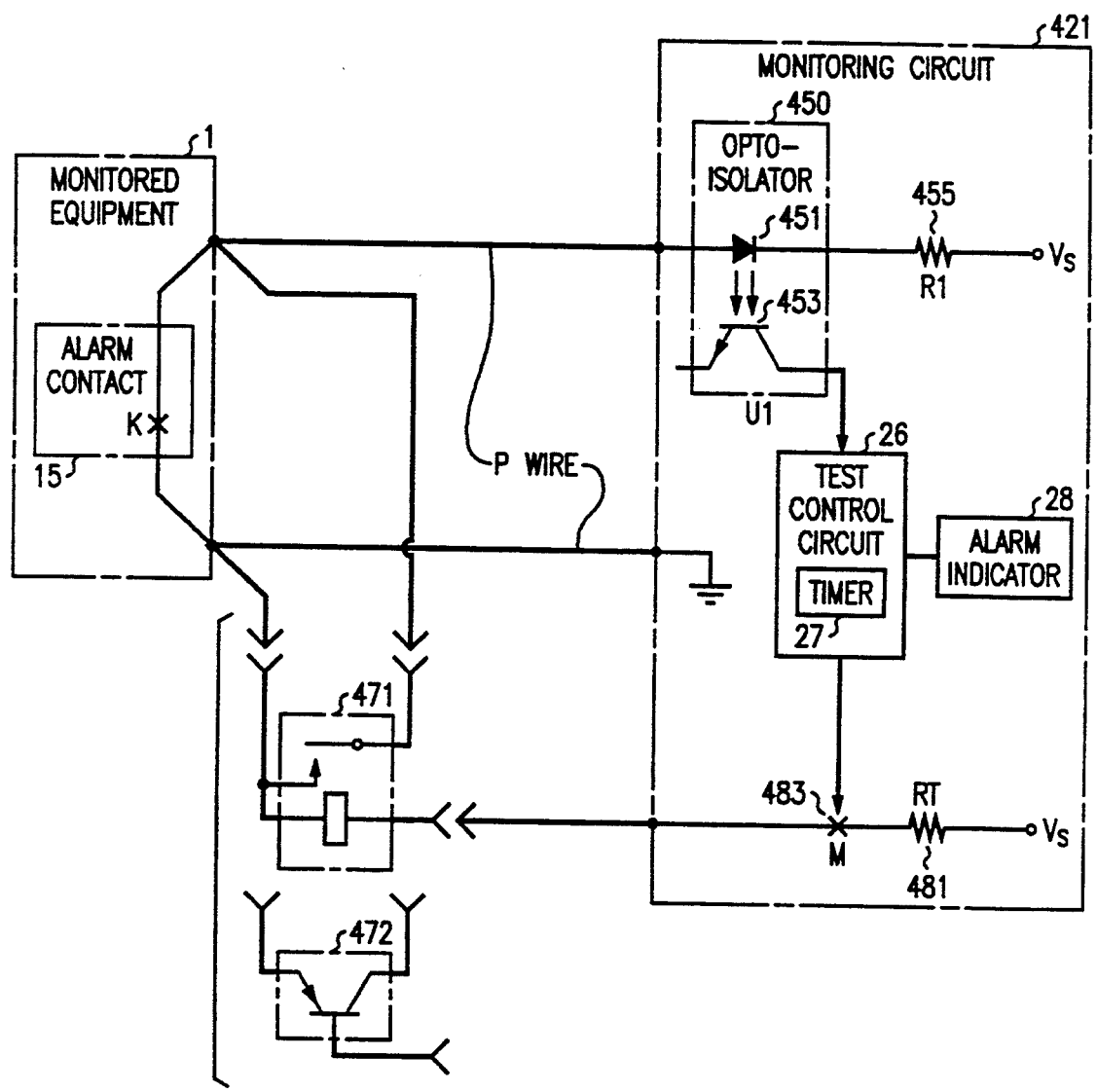
FIG. 4 illustrates the use of a testing device which is normally not conducting, but which is rendered conducting by means of a voltage on a separate test lead.

FIG. 4 illustrates an arrangement wherein a separate test lead is used to operate a test relay 471 or to make conductive a transistor 472 either of which is in parallel with contact K (15).

FIG. 4 shows a case where an extra controlling wire is needed to activate the applique' circuit and test the wire loop. The applique' circuit consists of a SPST relay 471 or transistor 472. Again, when contact K (15) closes or when contact 47 1 closes or transistor 472 is made conductive, opto-isolator 450 changes to the "on" state.

Figure 5:
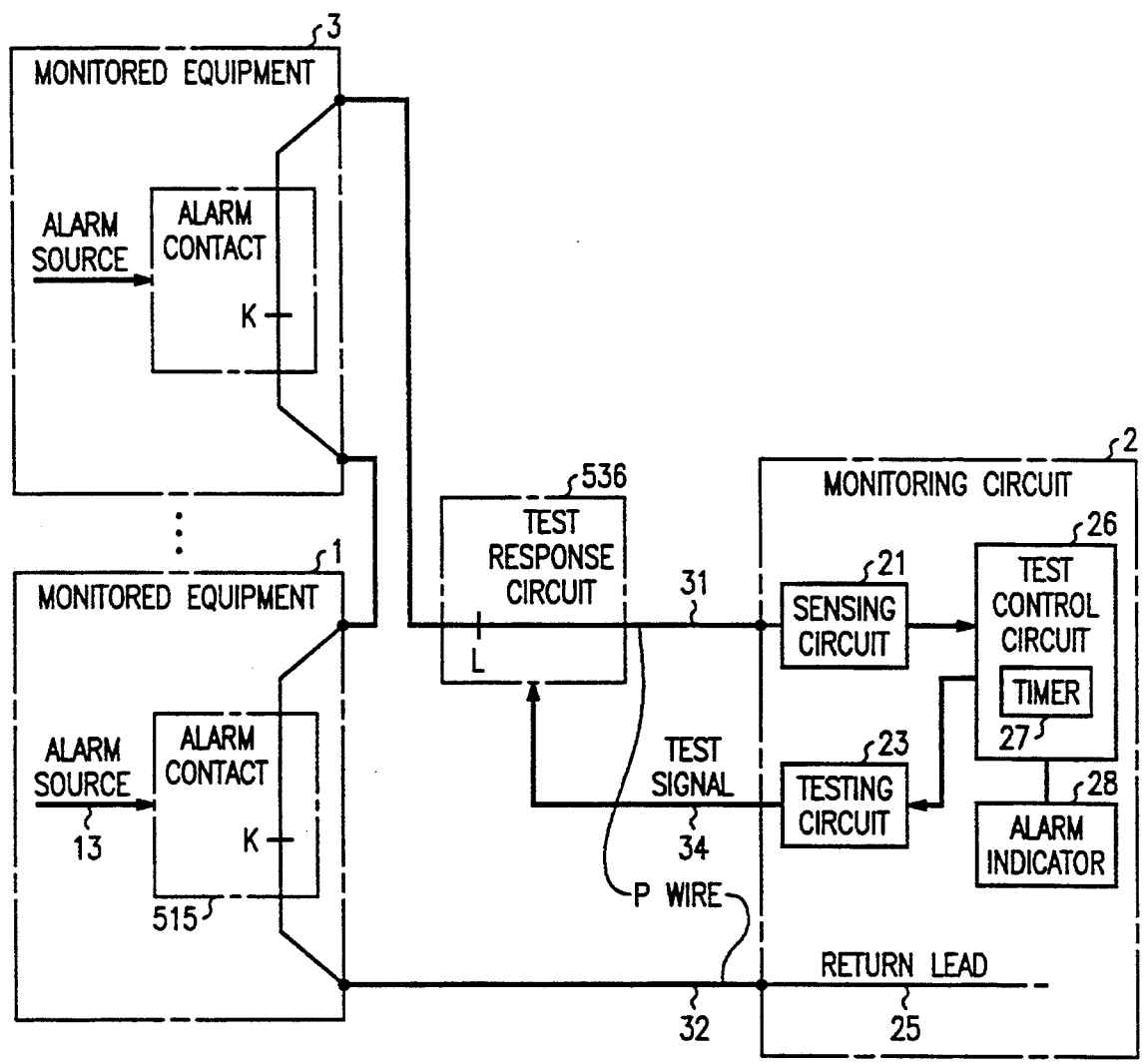
FIGS. 5–8 correspond to FIGS. 1–4 but are for use with an alarming device which is normally closed; the testing device can be used to detect short circuits across the access wires.
Figure 6:
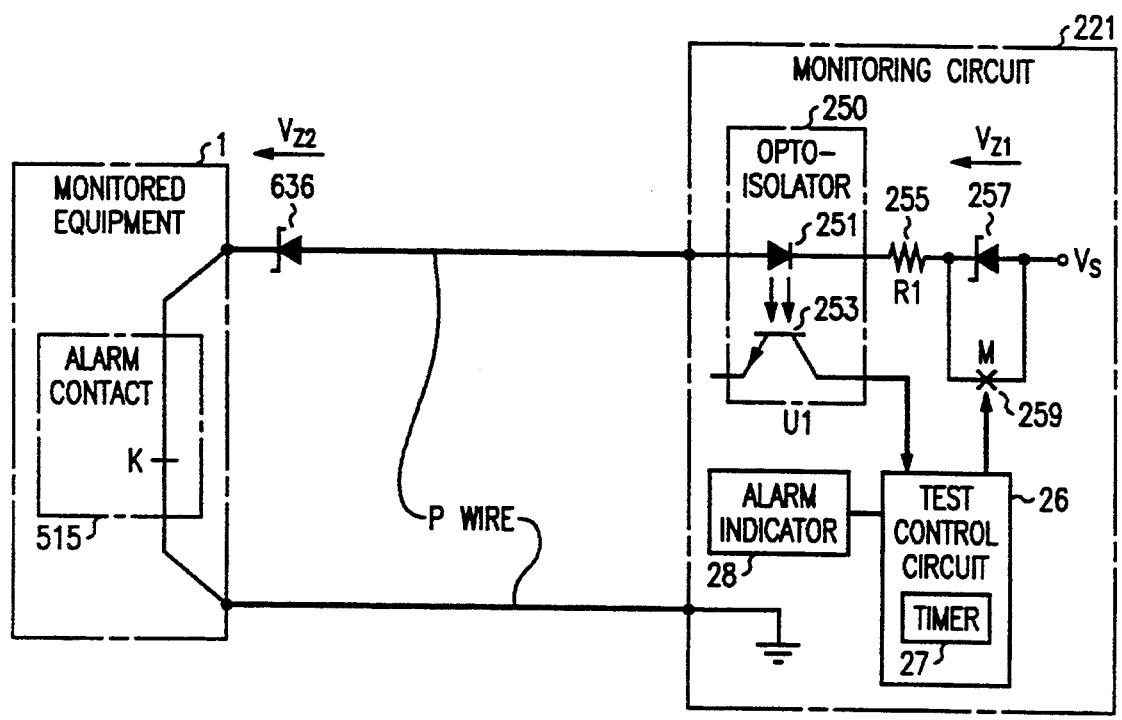
Figure 7:
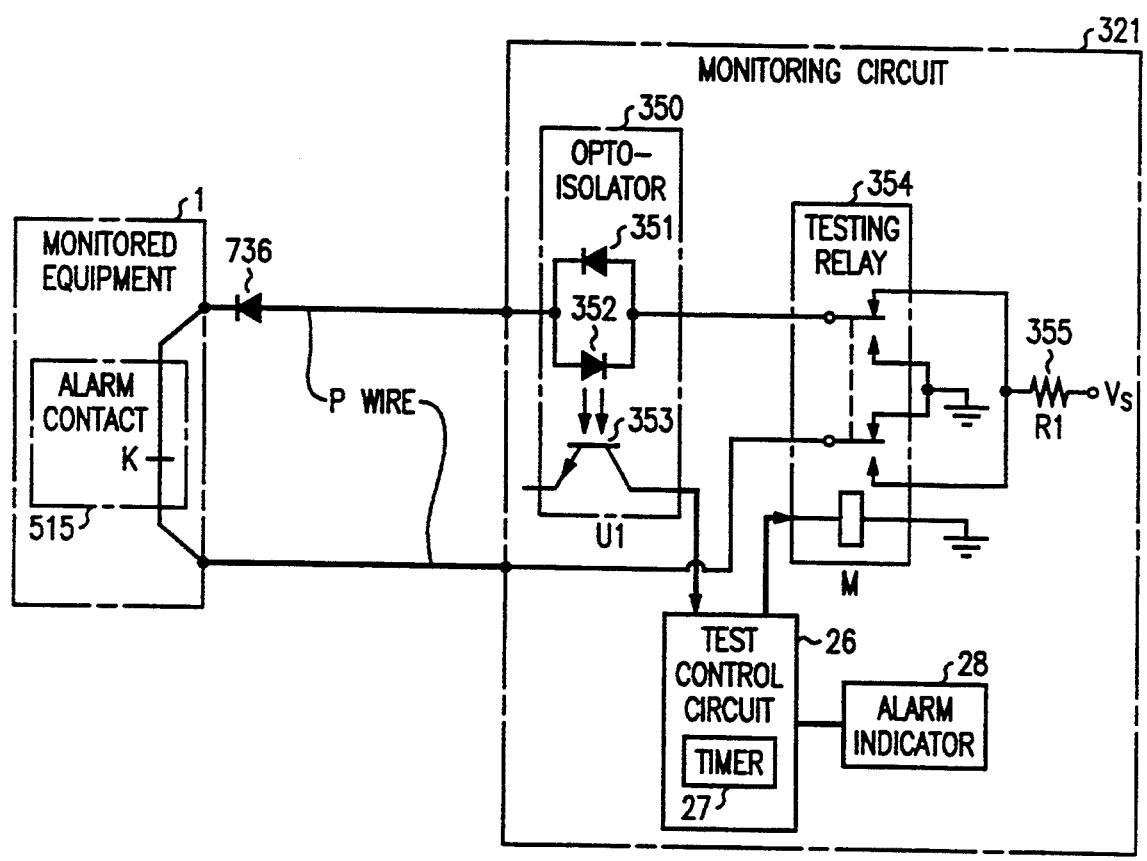
Figure 8:
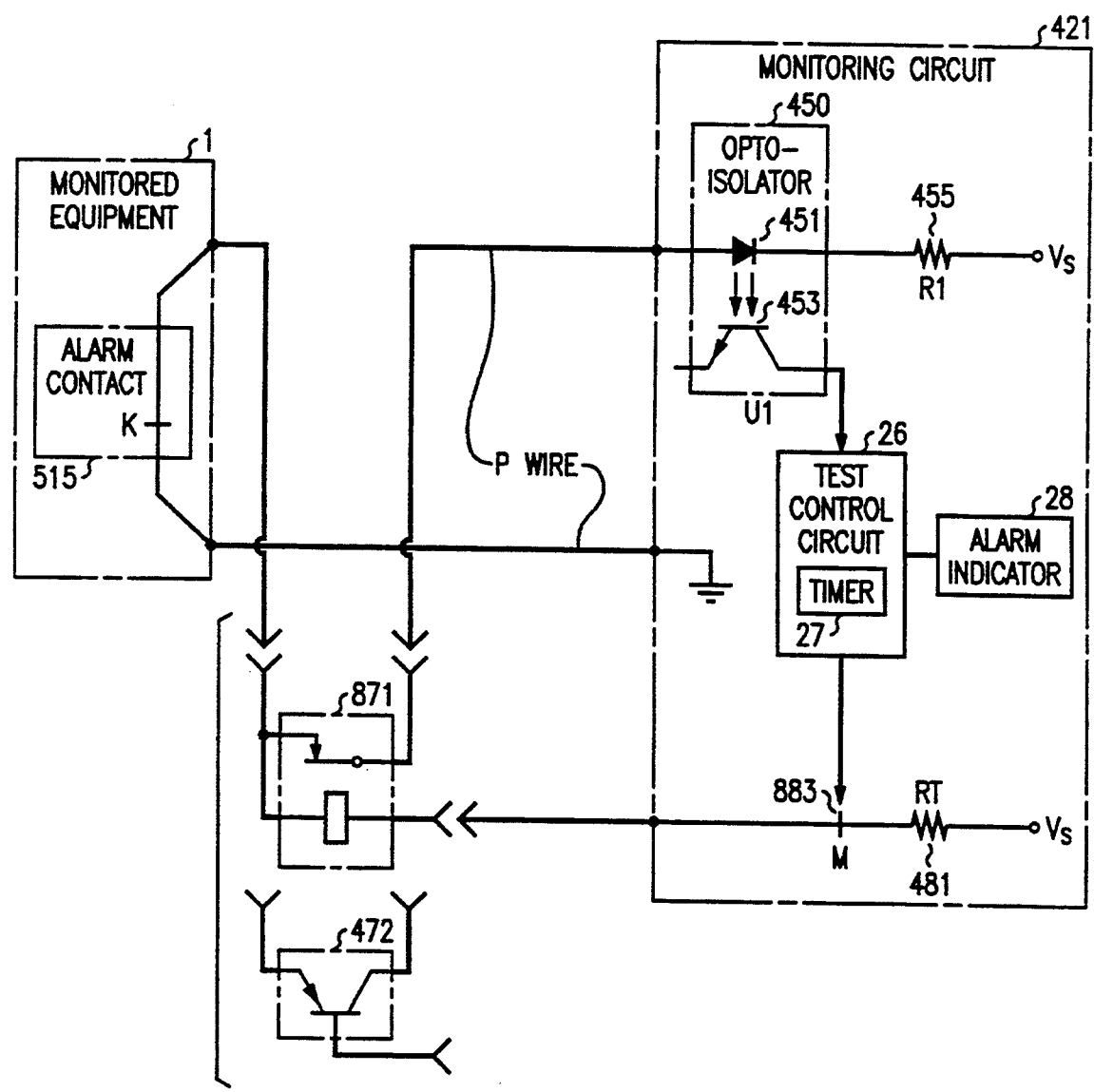

Note that any number of items of monitored equipment, such as monitored equipment 2, may be placed in parallel with the test contact L (36) of FIG. 1 or its equivalent in the other diagrams of FIGS. 2-4, or in series with test contact L (in block 536) of FIG. 5 or its equivalent in FIGS. 6-8, and that with such an arrangement the alarm sensing circuit will indicate an alarm if any of the monitored apparatus indicates an alarm or if the "P" wires are shorted or, for the case of FIGS. 5-8, opened. Under test conditions, an open in the "P" wires can be detected or for the case of FIGS. 5-8 and a short in the "P" wires can be detected.

FIGS. 5-8 correspond to FIGS. 1-4, but are for use with an alarm device having a normally closed contact. The testing device, which is also normally closed is in series with the alarm contact(s). (If there are several alarm contacts for one "P" wire connection, the alarm contacts are in series in this configuration.) By opening the testing device and checking for the opening of the circuit, the presence of a short circuit across the "P" wires can be detected; an open circuit (or alarm condition) is detected if, in the normal (non-test) state, no current flows over the "P" wires.

It is to be understood that the above description is only of one preferred embodiment of the invention. Numerous other arrangements may be devised by one skilled in the art without departing from the scope of the invention. The invention is thus limited only as defined in the accompanying claims.

We claim:

1. An alarm system comprising:
    means for responding (15) to an alarm indication (13) through the closure (alarm contact K) of an electrical circuit;
    means (21) for detecting said closure;
    test means (36) for closing said electrical circuit in response to a test signal; and
    means for generating (26,23) and transmitting (34) said test signal to said test means;
    means (26,28) for indicating an alarm in response to said means for detecting said closure when said test means is not closing said electrical circuit;
    whereby said test signal and test means are used to test whether said means for detecting is connected to said means for responding.

2. The apparatus of claim I wherein said means for responding comprises a contact (K) of a relay operated by means for detecting said alarm indication (13).

3. The apparatus of claim 1 wherein said test means comprises a zener diode (236) and said test signal comprises a voltage sufficient to break down said zener diode.

4. The apparatus of claim 1 wherein said means for detecting is connected by a wire connection (P wire) to said means for responding, and wherein said test signal is sent over said wire connection.

5. The apparatus of claim 1 further comprising another means (3) for responding to another alarm indication, and said another means is connected in parallel with said means for responding, whereby each of said means for responding and said another means can complete said electrical circuit in response to an alarm indication.

6. The apparatus of claim 1 wherein said test signal is transmitted over an electrical connection separate from the electrical circuit closed by said means for responding.

7. The apparatus of claim 1 wherein a common ground is used as one element of an electrical connection between said means for responding and said means for detecting.

8. An alarm system comprising:
means (515) for responding to an alarm indication (13) through the opening (alarm contact K) of an electrical circuit;
means (21) for detecting said opening;
test means (536) for opening said electrical circuit in response to a test signal;
means for generating (26, 23) and transmitting (34) said test signal to said test means;
means (26, 28) for indicating an alarm in response to said means for detecting said opening when said test means is not opening said electrical circuit; whereby said test signal and test means are used to test whether a connection between said means for detecting and said means for responding has been short-circuited.

9. The apparatus of claim 8 wherein said means for responding comprises a contact of a relay released by means for detecting said alarm indication (13).

10. The apparatus of claim 8 wherein said test means comprises a zener diode and said test signal comprises a voltage too low to break down said zener diode.

11. The apparatus of claim 8 wherein said means for detecting is connected by a wire connection to said means for responding, and wherein said test signal is sent over said wire connection.

12. The apparatus of claim 8 further comprising another means (2) for responding to another alarm indication, and said another means is connected in series with said means for responding, whereby each of said means for responding and said another means can open said electrical circuit in response to an alarm indication (13).

13. The apparatus of claim 8 wherein said test signal is transmitted over an electrical connection separate from the electrical circuit opened by said means for responding.

14. The apparatus of claim 8 wherein a common ground is used as one element of an electrical connection between said means for responding and said means for detecting.

* * * * *